United States Patent [19]

Miyata et al.

[11] Patent Number: 4,467,671
[45] Date of Patent: Aug. 28, 1984

[54] RELEASE MECHANISM FOR A PUSH-BUTTON TUNER

[75] Inventors: Hiroyasu Miyata, Furukawa; Keizo Watanabe; Akio Yamaguchi, both of Iwaki, all of Japan

[73] Assignee: Sanshin Electric Co., Ltd., Tokyo, Japan

[21] Appl. No.: 349,751

[22] Filed: Feb. 18, 1982

[30] Foreign Application Priority Data

Feb. 18, 1981 [JP] Japan ................................. 56-21694

[51] Int. Cl.³ ........................... H03J 5/12; F16H 1/18
[52] U.S. Cl. .................................. 74/10.85; 74/10.33; 74/424.8 A; 334/7
[58] Field of Search ................. 74/10.27, 10.33, 10.85, 74/424.8 A; 334/7

[56] References Cited

U.S. PATENT DOCUMENTS

| | | | |
|---|---|---|---|
| 1,075,888 | 10/1913 | Wolff | 74/424.8 A |
| 1,500,099 | 7/1924 | Anderson | 74/424.8 A |
| 3,724,280 | 4/1973 | Olah | 74/10.33 |
| 3,730,008 | 5/1973 | Sheesley | 74/424.8 A X |
| 4,118,992 | 10/1978 | Yamagishi | 74/10.85 X |
| 4,184,379 | 1/1980 | Bevacqua | 74/10.33 |
| 4,262,547 | 4/1981 | Kanai et al. | 74/10.85 X |
| 4,267,739 | 5/1981 | Nishikawa et al. | 74/10.33 |

*Primary Examiner*—Allan D. Herrmann
*Attorney, Agent, or Firm*—Guy W. Shoup; Gerard F. Dunne

[57] ABSTRACT

A release mechanism of a push-button tuner for use in car radios etc., comprising a manual tuning shaft which has a threaded portion, a release plate which is movably and turnably installed on a guide rod disposed in parallel with the manual tuning shaft and which is provided with a friction plate corresponding to the threaded portion, a core carriage which moves in the same direction as a moving direction of the release plate in interlocking with a movement thereof, and a release plate which is operated by depressing a push button. The friction plate and the threaded portion are held in engagement in the normal state, and the engagement is released when the push button is depressed.

3 Claims, 3 Drawing Figures

RELEASE MECHANISM FOR A PUSH-BUTTON TUNER

BACKGROUND OF THE INVENTION

The present invention relates to a clutch mechanism of a push-button tuner which may be used in a radio or the like for a vehicle, and more particularly, to a clutch mechanism suitable for push-button tuners having a low profile.

A known clutch mechanism for a push-button tuner is shown in FIGS. 1 and 2 by way of example.

Referring to the figures, numeral 1 designates a frame by which a manual tuning shaft 2 is turnably carried. The manual tuning shaft 2 is mounted perpendicularly to the plane of the frame 1, and its end protruding rightward from the frame 1 as viewed in FIG. 2 is formed with a pinion 2a.

On the other hand, numeral 3 designates a control lever, which is connected to a tuning slider, not shown, of the tuner. The tuning slider is operated by depressing a push button (not shown), and functions to move a core within a tuning coil. The control lever 3 is disposed in parallel with the plane of the frame 1, and has a rod portion 3a extended therefrom.

A clutch mechanism to be described below is disposed between the control lever 3 and the manual tuning shaft 2.

A pulley 4 having a V-shaped peripheral groove 4a adapted to receive the rod portion 3a is turnably carried by the frame 1 through a shaft 4b. A gear 5 is fixedly mounted on the shaft 4b, and meshes with the pinion 2a. A roller 6a for holding the rod portion 3a in pressed contact with the peripheral groove 4a is disposed below the rod portion 3a. The roller 6a is installed on one end of a bell crank lever 6, which is turnably carried on the frame 1 through a turning shaft 6b.

The other end of the bell crank lever 6 is turnably mounted on a clutch-release rod 7 through a pin 6c. The clutch-release rod 7 is operated by depressing a push button of the tuner so that a coiled spring 8 disposed between an end part of the clutch release rod 7 and the frame 1 turn the bell crank lever 6 in the clockwise direction as viewed in FIG. 1. In the normal state when the push button is not depressed, the rod portion 3a is held in pressed contact with the peripheral groove 4a by the roller 6a, and the clutch mechanism is in its engaged state (hereinbelow, the clutch mechanism is considered in its engaged state. When a push button of the tuner is depressed, the roller 6a is turned away from rod portion 3a to disengage the rod portion 3a from the peripheral groove 4a of the pulley 4.

When, the clutch mechanism is engaged, the manual tuning shaft 2 can be operated to turn the pulley 4 and reciprocate the control lever 3 to manually select a channel of the tuner. On the other hand, when a push button of the tuner is depressed, the clutch release rod 7 is moved leftward in FIG. 1 to disengage the pulley 4 from the rod portion 3a, and a channel selection by depressing the push button can be executed.

In such prior-art clutch mechanisms however, the manual tuning shaft 2 and the control lever 3 are mounted in directions orthogonal to each other, and the transmission and reduction means formed by the pinion 2 and the gear 5, as well as the motion conversion means formed by the pulley 4 having the peripheral groove 4a, the rod 3a, the roller 6a etc. and serving to convert a rotational motion into a rectilinear motion; are arranged between the manual tuning shaft 2 and the control lever 3. Therefore, the prior art has the problem that, due to the development of a conversion loss, a deviation is liable to occur between the operated tuning amount of the manual turning shaft and the moving amount of the core, so accurate manual tuning is difficult. Another problem is that the number of components is large.

SUMMARY OF THE INVENTION

The present invention has been made in view of the problems of the prior art as described above, and has for its object to provide a clutch mechanism of a push-button tuner which is free from such problems.

According to the present invention, a release mechanism of a push-button tuner comprises a manual tuning shaft which has a threaded portion, a reaction plate which is movably and turnably installed on a guide rod disposed in parallel with said manual tuning shaft and which is provided with a friction pad corresponding to said threaded portion, a core carriage which moves in the same direction as a moving direction of said reaction plate in interlocking with a movement thereof, and a release plate which is operated by depressing a push button. The friction plate and threaded portion are normally held in engagement, the engagement being released when a push button is depressed.

PREFERRED EMBODIMENT OF THE INVENTION

Figure 1:
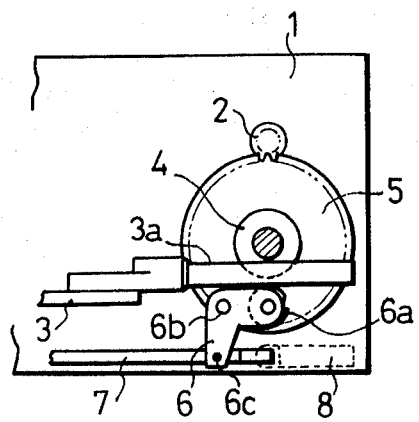
FIG. 1 is a front view showing a prior-art clutch mechanism of a push-button tuner.
Figure 2:
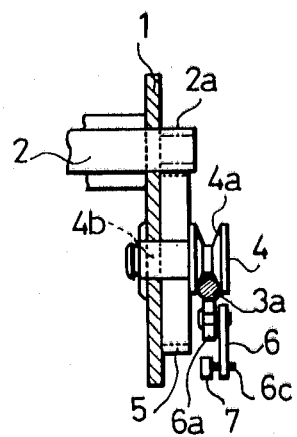
FIG. 2 is a side view of the clutch mechanism of FIG. 1.

Hereunder, the present invention will be described with reference to the drawing.

Figure 3:
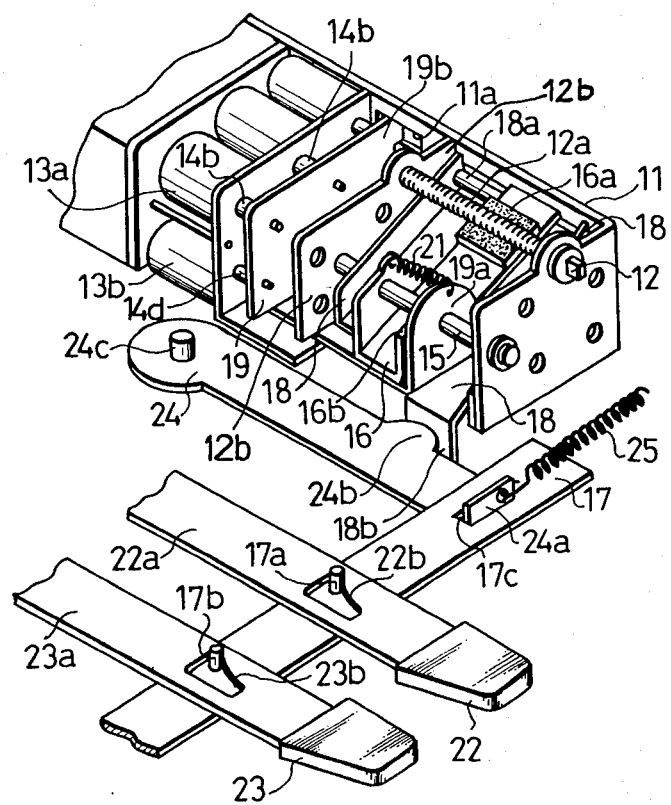
FIG. 3 is a fragmentary perspective view showing a clutch mechanism of a push-button tuner embodying the present invention.

FIG. 3 is a view showing an embodiment of the present invention.

Numerals 11 in the figure designates a frame. Groups of tuning coils 13a and 13b for, e.g., of the respective tuning coil AM and FM are mounted in a relatively rear part of the frame 11. Cores 14a, 14b, 14c are furnished for the respective tuning coils in a manner to be capable of movement within predetermined strokes. On the front side of the frame 11, a manual tuning shaft 12 having a threaded portion 12a is turnably disposed, with its inner end supported by plate 12b By way of example, the threaded portion 12a is formed of a double thread screw at pitches of 0.6 mm. The axis of the manual tuning shaft 12 extends in the same direction as the direction of movements of the cores. A knob shaft, etc., not shown, are coupled to an end part of the manual tuning shaft 12.

Further, a guide rod 15 is mounted on the frame 11 in parallel with the manual tuning shaft 12, and a reaction plate 16 is slidably and turnably installed on the guide rod 15. A friction pad 16a corresponding to the threaded portion 12a is fastened to the reaction pad 16. By way of example, the friction plate 16a is fabricated by an elastic member having a large coefficient of friction, such as a rubber member.

On the rear surface side of the reaction plate is disposed a crank 18 which is similarly installed on the guide rod 15 in a turnable fashion. The crank 18 is generally channel-shaped, and its length in the axial direction of the guide rod 15 is made somewhat greater than the required stroke length of the cores. A rod 18a is mounted on the reward portion of one side of the crank 18, and is held in opposed contact with the rear surface of the reaction plate 16. On the forward portion of the other side of the crank 18, an engaging tongue 18b is extended downward as viewed in FIG. 3.

Further, a core carriage 19 is movably installed on the guide rod 15. The core carriage 19 has the cores 14a, 14b, 14c mounted thereon, and has a bent portion 19a formed at its forward end which is held in opposition to a bent portion 16b on the forward portion of the reaction plate 16. A side plate portion of the frame 11 adjacent to the core carriage 19 is provided with a guide slot 11a for slidably receiving a guide projection 19b extending laterally from the core carriage. Owing to the guide projection 19b, the core carriage 19 may not turning about the guide rod 15 and any play in the turning direction is restrained. A coiled spring 21 is disposed in tension between the bent portion 19a of the core carriage 19 and the reaction plate 16, and the core carriage 19 is urged rearwardly of the frame 11 by the resilient force of the coiled spring 21. The spring 21 normally holds the bent portion 19a of the core carriage in pressed contact with the bent portion 16b of the reaction plate, and the core carriage 19 thus follows the movement of the reaction plate 16.

Numerals 22 and 23 designate push buttons, and symbols 22a and 23a represent push-button rods joined to the respective push buttons 22 and 23. A release plate 17 is disposed transversely to the push-button rods 22a and 23a.

In the portions of the push-button rods 22a and 23a crossing the release plate 17, by way of example, taper cams 22b and 23b and pins 17a and 17b extend upwardly from the release plate 17 in correspondence with the respective taper cams 22b and 23b.

Although only the two push buttons are depicted in the figure and others are omitted, there are actually disposed, for example, three push buttons for selecting the channels of AM broadcast and two push buttons for selecting the channels of FM broadcast, totaling five push buttons. Tuning slide plates, not shown, are disposed between these push buttons and the core carriage 19. Upon depressing the desired push button, the core carriage 19 is moved through the corresponding tuning slide plate an amount corresponding push button selected.

On the portion of the release plate 17 closer to the manual tuning shaaft 12 an engaging hole 17c is provided to receive a bent portion 24a of a lever 24 in fitted engagement. The lever 24 is formed with a protuberance 24b adjacent the engaging tongue 18b of the crank 18, and its other end is turnably carried on an extension (not shown) of the frame 11 through a pin 24c. In addition, spring 25 is tensed between the bent portion 24a and the frame 11, and the protuberance 24b is thus normally urged against the engaging tongue 18b owing to the resilient force of the spring 25.

Owing to the resilient force of the spring 25, the release plate 17 is normally urged rightwardly as viewed in FIG. 3 and is stationary in its inoperative position.

Now, the operation of the release mechanism will be described.

First, manual tuning will be explained. While any of the push-buttons are not operated, in other words, in the nornal state, the reaction plate 16 is turned toward the manual tuning shaft 12 by the resilient force of the spring 25 urging the protuberance 24b of the clutch lever 24 against the engaging tongue 18b of the crank 18 to pivot the rod 18a thereon upwardly. The friction pad 16a is resiliently brought into engagement with the threaded portion 12a, to establish a threadable engagement state, so that the release mechanism is engaged.

When the manual tuning shaft 12 is in the engaged state, the reaction plate 16 is moved an amount corresponding to the amount of the turning operation in accordance with the pitch of the threaded portion 12a, and following the movement of the clutch plate 16, the core carriage 19 is moved to position the cores in the respective coils.

Assuming that the threaded portion 12a is formed of the double thread screw having a pitch of 0.6 mm as described before and that the core strokes are 9 mm, the cores can be moved through their entire by 7.5 revolutions of the manual tuning shaft 12.

The tuner is tuned to a desired channel by operating the manual tuning shaft 12 a required amount.

In such manual tuning operation, when the core carriage 19 moves, the tuning slide plate responds to the movement and moves an amount corresponding to the amount of the movement. If necessary, accordingly, the push buttons can be preset after the manual tuning operation.

Next, a channel selected by actuation of a push button will be explained. Let it now be supposed that a broadcasting station corresponding to the push button 22 is to be selected. When the push button 22 is depressed, the release plate 17 is moved leftward in FIG. 3 against the resilient force of the spring 25 through the engaged portion between the taper cam 22b and the pin 17a.

Owing to this movement, the protuberance 24b is released from the tongue 18b, and the crank 18 and the clutch plate 16 fall in the clockwise direction of FIG. 3. The threadable engagement between the threaded portion 12a and the friction pad 16a is released, so that the release mechanism is disengaged.

When the push button 22 is kept depressed in the disengaged state, the tuning slide plate is moved a preset amount corresponding to the particular push button, and the cores respond to movement in predetermined amounts. Thus, the desired channel is selected.

In the above embodiment, the lever 24 and the crank 18 are interposed between the release plate 17 and the reaction plate 16. In the present invention, however, the lever 24 and the crank 18 are not indispensable constituents. These members may well be dispensed with in such as way that an engaging portion similar to the engaging tongue 18b is extended from the plate 16 itself downwardly as viewed in FIG. 3, while a proper arm portion is projected from the release plate 17 so as to correspond to the engaging portion. When the reactive plate 16 moves in the manual tuning operation, the engaging portion moves the arm portion in sliding contact therewith.

While the threaded portion 12a has been described as to the case of a double thread screw having the pitches of 0.6 mm, the pitch and the number of threads can be properly selected. The proper selection of the pitch and the number of threads makes it possible to adjust the amount of movement of the reaction plate 16 relative to the unit amount of rotation of the manual tuning shaft 12.

As described above in detail, according to the present invention, a clutch mechanism of a push-button tuner comprises a manual tuning shaft which has a threaded portion, a reaction plate which is movably and turnably installed on a guide rod disposed in parallel with said manual tuning shaft and which is provided with a friction pad corresponding to said threaded portion, a core carriage which moves in the same direction as a moving direction of said reaction plate in interlocking movement thereof, and a clutch release plate which is operated by depressing a push button. The friction pad and threaded portion are normally held in engagement, the engagement being released when a push button is depressed. Therefore, only the reaction plate provided with the friction pad need be interposed between the manual tuning shaft and the core carriage, and the number of required components is much smaller than prior-art mechanisms. Accordingly, deviation between the operation of the manual turning shaft and the movement of the cores is remarkably improved, and the manual tuning operation can be made easy and accurate.

We claim:

1. A clutch mechanism of a push-button tuner, comprising:
    a manual tuning shaft having a threaded portion,
    a reaction plate movably and turnably installed on a guide rod disposed in parallel with said manual tuning shaft, said reaction plate being provided with a friction pad corresponding to said threaded portion,
    a core carriage movable in the same direction as a moving direction of said reaction plate in interlocking movement therewith, thereby to execute variable tuning, and
    a release plate operated by depressing a push button, said friction pad and said threaded portion being normally held in engagement,
    the engagement being released when said push button is depressed.

2. A clutch mechanism of a push-button tuner according to claim 1, wherein a crank is movably and turnably mounted on said guide rod, and said crank is provided with a rod for bringing said friction pad of said reaction plate into engagement with said threaded portion of said manual tuning shaft.

3. A clutch mechanism of push-button tuner according to claim 2, wherein a turnable lever is interposed between said crank and said reaction plate.

* * * * *